(12) United States Patent
Lam et al.

(10) Patent No.: US 8,719,606 B2
(45) Date of Patent: May 6, 2014

(54) OPTIMIZING PERFORMANCE AND POWER CONSUMPTION DURING MEMORY POWER DOWN STATE

(75) Inventors: Son H. Lam, Puyallup, WA (US); James W. Alexander, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1353 days.

(21) Appl. No.: 12/059,994

(22) Filed: Mar. 31, 2008

(65) Prior Publication Data

US 2009/0249097 A1 Oct. 1, 2009

(51) Int. Cl.
*G06F 1/00* (2006.01)
*G06F 1/26* (2006.01)
*G06F 1/32* (2006.01)

(52) U.S. Cl.
USPC .......................... 713/322; 713/300; 713/320

(58) Field of Classification Search
CPC .......... G06F 1/00; G06F 1/3275; G06F 1/324
USPC ........................................ 713/300, 320, 322
See application file for complete search history.

(56) References Cited

U.S. PATENT DOCUMENTS

| | | | |
|---|---|---|---|
| 2003/0016740 A1 | 1/2003 | Jeske et al. | |
| 2003/0039151 A1 * | 2/2003 | Matsui | 365/195 |
| 2003/0217296 A1 | 11/2003 | Ma | |
| 2005/0138442 A1 * | 6/2005 | Keller et al. | 713/300 |
| 2005/0180229 A1 * | 8/2005 | Jin | 365/194 |
| 2006/0265617 A1 | 11/2006 | Priborsky | |
| 2007/0002988 A1 * | 1/2007 | Kim | 375/354 |
| 2007/0030030 A1 * | 2/2007 | Waldrop | 326/93 |
| 2007/0050550 A1 * | 3/2007 | Farrell | 711/118 |
| 2007/0245163 A1 | 10/2007 | Lu et al. | |
| 2008/0028240 A1 | 1/2008 | Arai et al. | |
| 2008/0082763 A1 * | 4/2008 | Rajan et al. | 711/154 |
| 2008/0159026 A1 * | 7/2008 | Oh et al. | 365/194 |
| 2008/0294928 A1 * | 11/2008 | Jain et al. | 713/600 |
| 2009/0019243 A1 | 1/2009 | Hur et al. | |
| 2009/0172441 A1 | 7/2009 | Kant et al. | |

OTHER PUBLICATIONS

Office Action Received for U.S. Appl. No. 11/967,912, mailed on Sep. 13, 2010, 16 pages.
Hwang et al., "A Predictive System Shutdown Method for Energy Saving of Event-Driven Computation", ACM Transactions on Design Automation of Electronic Systems, vol. 5, No. 2, Apr. 2000, pp. 226-241.
Gunaratne et al., "Predictive Power Management Method for Network Device", Electronics Letters, vol. 41, No. 13, Jun. 23, 2005, 2 pages.
Golding et al., "Idleness is not Sloth", Winter'95 USENIX Technical Conference, New Orleans, LA, Jan. 16-19, 1995, pp. 1-3.
Wilkes, "Predictive Power Conservation", Hewlett-Packard Laboratories, HPL-CSP-92-5, Feb. 14, 1992, 1 page.

* cited by examiner

*Primary Examiner* — Paul Yanchus, III
*Assistant Examiner* — Brandon Kinsey
(74) *Attorney, Agent, or Firm* — Caven & Aghevli LLC

(57) ABSTRACT

Methods and apparatus relating to optimization of performance and/or power consumption during memory power down state are described. In an embodiment, a memory controller may include logic to cause one or more ranks of a DIMM to enter a clock enable slow mode. Other embodiments are also described.

21 Claims, 6 Drawing Sheets

| a | r1 | r0 | c1 | c0 | R1 | R0 |
|---|---|---|---|---|---|---|
| 0 | 0 | 0 | 0 | 0 | 0 | 1 |
| 0 | 0 | 0 | 0 | 1 | 0 | 1 |
| 0 | 0 | 0 | 1 | 0 | 1 | 0 |
| 0 | 0 | 0 | 1 | 1 | 1 | 1 |
| 0 | 0 | 1 | 0 | 0 | 0 | 1 |
| 0 | 0 | 1 | 0 | 1 | 0 | 1 |
| 0 | 0 | 1 | 1 | 0 | 1 | 0 |
| 0 | 0 | 1 | 1 | 1 | 1 | 1 |
| 0 | 1 | 0 | 0 | 0 | 1 | 0 |
| 0 | 1 | 0 | 0 | 1 | 0 | 1 |
| 0 | 1 | 0 | 1 | 0 | 1 | 0 |
| 0 | 1 | 0 | 1 | 1 | 1 | 1 |
| 0 | 1 | 1 | 0 | 0 | 0 | 1 |
| 0 | 1 | 1 | 0 | 1 | 0 | 1 |
| 0 | 1 | 1 | 1 | 0 | 1 | 0 |
| 0 | 1 | 1 | 1 | 1 | 1 | 1 |
| 1 | 0 | 0 | 0 | 0 | 0 | 0 |
| 1 | 0 | 0 | 0 | 1 | x | x |
| 1 | 0 | 0 | 1 | 0 | x | x |
| 1 | 0 | 0 | 1 | 1 | x | x |
| 1 | 0 | 1 | 0 | 0 | 0 | 0 |
| 1 | 0 | 1 | 0 | 1 | x | x |
| 1 | 0 | 1 | 1 | 0 | x | x |
| 1 | 0 | 1 | 1 | 1 | x | x |
| 1 | 1 | 0 | 0 | 0 | 0 | 0 |
| 1 | 1 | 0 | 0 | 1 | x | x |
| 1 | 1 | 0 | 1 | 0 | x | x |
| 1 | 1 | 0 | 1 | 1 | x | x |
| 1 | 1 | 1 | 0 | 0 | 0 | 0 |
| 1 | 1 | 1 | 0 | 1 | x | x |
| 1 | 1 | 1 | 1 | 0 | x | x |
| 1 | 1 | 1 | 1 | 1 | x | x |

*FIG. 4*

OPTIMIZING PERFORMANCE AND POWER CONSUMPTION DURING MEMORY POWER DOWN STATE

FIELD

The present disclosure generally relates to the field of electronics. More particularly, an embodiment of the invention relates to optimization of performance and/or power consumption during memory power down state.

BACKGROUND

In memory devices, on-die-termination (ODT) may be used while Dual Inline Memory Modules (DIMMs) are being accessed, for example, during a read or a write cycle. ODT may reduce potential signal noise or interference during memory access. However, activating ODT also results in additional power consumption.

Generally, a memory controller coupled to a DIMM utilizes a channel to communicate with the DIMM. In some current designs, there may be one DIMM present for each channel. In such situations, one may use a Precharge Power Down Delay-Locked Loop (DLL) off mode only for the one DIMM per channel. However, in some computing platforms (such as server computers), there may be more than one DIMM per channel; thus, more power may be saved if any of the ranks may be placed in the Precharge Power Down DLL off (PD) state. However, when a DIMM in a multi-DIMM per channel configuration is placed in the PD state, system performance may be impacted due to asynchronous ODT operations.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIG. 4 illustrates an embodiment of a logic truth table for values at various reference points shown in FIG. 3.

DETAILED DESCRIPTION

Figure 1:
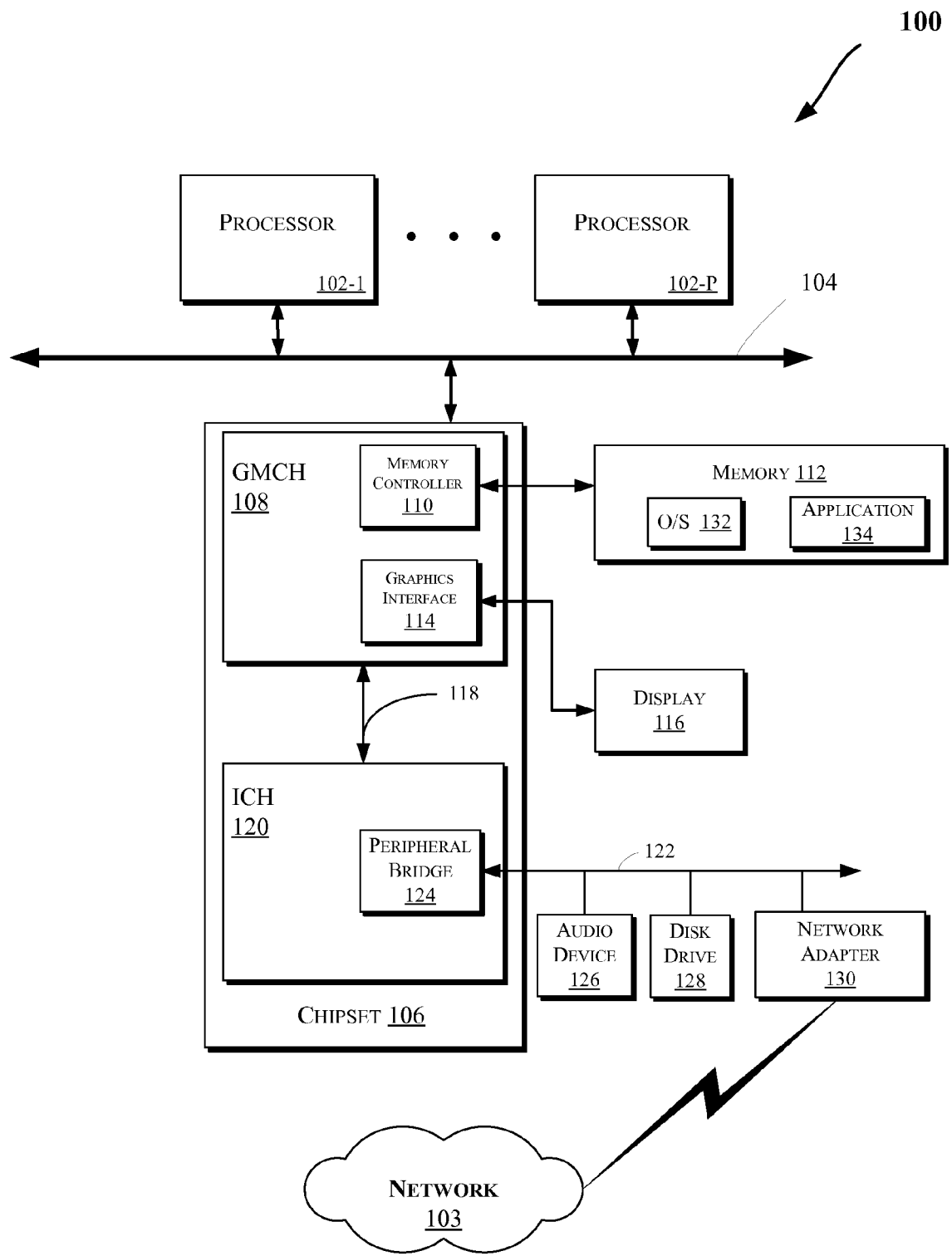
FIGS. 1 and 6 illustrate block diagrams of embodiments of computing systems, which may be utilized to implement various embodiments discussed herein.

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some of the embodiments discussed herein may be utilized to improve memory performance and/or power consumption. In an embodiment, a memory low power policy may be used to optimize the performance and/or power consumption for Double Data Rate (DDR) Dynamic Random Access Memory (DRAM), including for example DDR3 DRAMs, DLL off pre-charge power down (PD) state. For example, a technique and associated circuitry is provided to put memory into CKEs (clock enable signals) state for saving power without or with reduced impact on the performance due to asynchronous ODT operations. In an embodiment, a policy for entering PD state in a system with more than one DIMM per channel may be used to save power, without or with reduced impact to the system performance. In some current designs, there may be one DIMM present per each channel. A rank is generally defined as a group of DRAM components on a DIMM that form a 64-bit word (8 bytes) for data transfer. For an ECC (Error Correcting/Correction Code) DIMM, a rank generally refers to a block of 72 bits (64 data bits plus 8 ECC bits). A DIMM may have up to 4 ranks in some implementations. A channel generally refers to a physical interface between a memory controller (such as the memory controller 110 of FIG. 1) and memory (such as the memory 112 of FIG. 1). Multiple DIMMs may be placed on a channel in some embodiments. Moreover, a memory controller may have multiple memory channels.

More particularly, FIG. 1 illustrates a block diagram of a computing system 100 in accordance with an embodiment of the invention. The computing system 100 may include one or more central processing unit(s) (CPUs) or processors 102-1 through 102-P (which may be referred to herein as "processors 102" or "processor 102"). The processors 102 may communicate via an interconnection network (or bus) 104. The processors 102 may include a general purpose processor, a network processor (that processes data communicated over the computer network 102), or other types of a processor (including a reduced instruction set computer (RISC) processor or a complex instruction set computer (CISC)). Moreover, the processors 102 may have a single or multiple core design. The processors 102 with a multiple core design may integrate different types of processor cores on the same integrated circuit (IC) die. Also, the processors 102 with a multiple core design may be implemented as symmetrical or asymmetrical multiprocessors. In an embodiment, various operations discussed herein may be performed by one or more components of the system 100.

A chipset 106 may also communicate with the interconnection network 104. The chipset 106 may include a graphics memory control hub (GMCH) 108. The GMCH 108 may include a memory controller 110 that communicates with a main system memory 112. Further details regarding operation and/or logic included within the memory controller 110 will be further discussed herein, e.g., with reference to FIGS. 2-5. The memory 112 may store data, including sequences of instructions that are executed by the processor 102, or any other device included in the computing system 100. In one embodiment of the invention, the memory 112 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 104, such as multiple CPUs and/or multiple system memories.

The GMCH 108 may also include a graphics interface 114 that communicates with a display device 116 (e.g., through a graphics accelerator (not shown)). In one embodiment of the invention, the graphics interface 114 may communicate with the display device 116 via an accelerated graphics port (AGP). In an embodiment of the invention, the display device 116 (such as a flat panel display, a cathode ray tube (CRT), a projection screen, etc.) may communicate with the graphics interface 114 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display device 116.

A hub interface 118 may allow the GMCH 108 and an input/output control hub (ICH) 120 to communicate. The ICH 120 may provide an interface to I/O devices that communicate with the computing system 100. The ICH 120 may communicate with a bus 122 through a peripheral bridge (or controller) 124, such as a peripheral component interconnect (PCI) bridge, a universal serial bus (USB) controller, or other types of peripheral bridges or controllers. The bridge 124 may provide a data path between the processor 102 and peripheral devices. Other types of topologies may be utilized. Also, multiple buses may communicate with the ICH 120, e.g., through multiple bridges or controllers. Moreover, other peripherals in communication with the ICH 120 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 122 may communicate with an audio device 126, one or more disk drive(s) 128, and one or more network interface device(s) 130 (which is in communication with a computer network 103 and may comply with one or more of the various types of communication protocols). In an embodiment, the network interface device 130 may be a NIC. Other devices may communicate via the bus 122. Also, various components (such as the network interface device 130) may communicate with the GMCH 108 in some embodiments of the invention. In addition, the processor 102 and other components shown in FIG. 1 (including but not limited to the GMCH 108, one or more components of the GMCH 108 such as the memory controller 110, etc.) may be combined to form a single integrated circuit chip. Furthermore, a graphics accelerator may be included within the GMCH 108 in some embodiments of the invention.

Additionally, the computing system 100 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 128), a floppy disk, a compact disk ROM (CD-ROM), a digital versatile disk (DVD), flash memory, a magneto-optical disk, or other types of nonvolatile machine-readable media that are capable of storing electronic data (e.g., including instructions). In an embodiment, components of the system 100 may be arranged in a point-to-point (PtP) configuration. For example, processors, memory, and/or input/output devices may be interconnected by a number of point-to-point interfaces, such as discussed with reference to FIG. 6 for example.

As illustrated in FIG. 1, the memory 112 may include one or more of an operating system(s) (O/S) 132 or application(s) 134. The memory 112 may also store one or more device driver(s), packet buffers, descriptors (which may point to the buffers in some embodiments), network protocol stack(s), etc. to facilitate communication over the network 102. Programs and/or data in the memory 112 may be swapped into the disk drive 128 as part of memory management operations. The application(s) 134 may execute (on the processor(s) 102) to communicate one or more packets with one or more computing devices coupled to the network 102.

Figure 2:
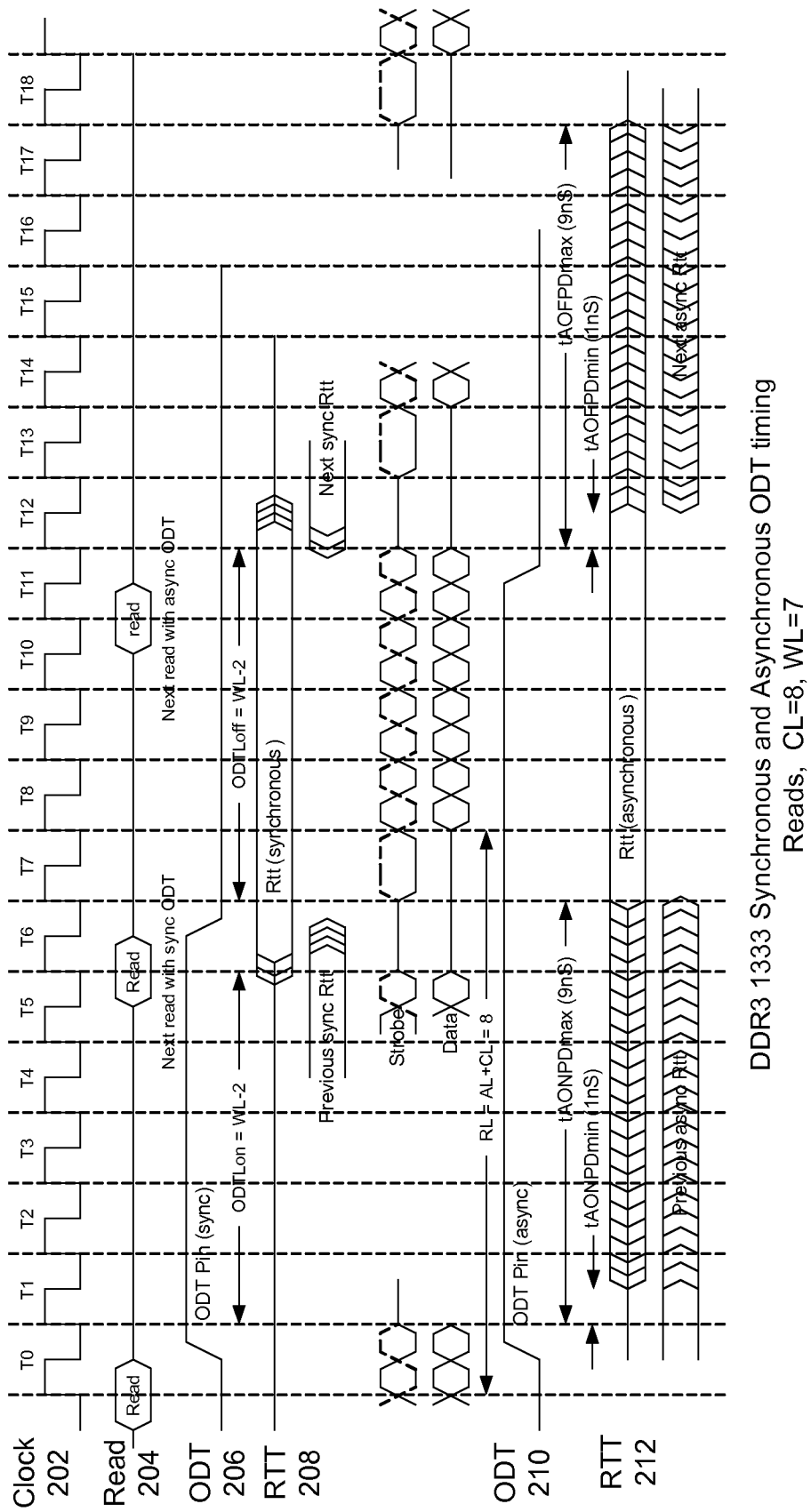
FIG. 2 illustrates a timing diagram for various signals associated with a sample DDR memory device.

FIG. 2 illustrates a timing diagram for various signals associated with a sample DDR memory device. Moreover, FIG. 2 illustrates the timing diagram of various signals relative to a clock signal 202 for a DDR3 1333 synchronous and asynchronous ODT timing read operations (204) with CL (CAS (Column Address Strobe) Latency) of 8 and WL (Write Length) of 7. FIG. 2 in part shows the performance penalty associated with asynchronous ODT operations which may have to be used in a multi-DIMM per channel configuration.

As shown in FIG. 2, the first group of signals (corresponding to ODT synchronous control signal 206 (e.g., on ODT pin) indicate synchronous operations, while the remaining group of signals (corresponding to ODT asynchronous control signal 210 (e.g., on ODT pin) indicate asynchronous operations. In FIG. 2, ODTLon refers to ODT turn on latency, ODTLoff refers to ODT turn off latency, RL refers to Read Length, AL refers to Additional Latency, tAOFPDmin refers to Asynchronous RTT (which is a resistor and FIG. 2 shows its conditions in synchronous and asynchronous modes) turn off delay time minimum, tAOFPDmax refers to Asynchronous RTT turn off delay time maximum, tAONPDmin refers to Asynchronous RTT turn on delay time minimum, and tAONPDmax refers to Asynchronous RTT turn off delay time maximum.

As shown in FIG. 2, due to the unpredictable nature of asynchronous operations (associated with the relatively longer period of assertion of ODT signal 210 versus ODT signal 206, e.g., required per the tAOFPDmax and tAOFPDmin versus ODTLon and ODTLoff), the ODT would have to be activated for longer periods, resulting in additional power consumption. Also, due to the unpredictable occurrence of Rtt 212 for asynchronous operations at startup and at turn off, asynchronous operations may also result in a performance penalty.

For example, for synchronous operations, the ODT control signal 206 is turned off at T7 and the internal logic will wait until some time later (T12) to turn off RTT 208. Hence, for the synchronous case, one may perform the next data transfer at T14. On the contrary, for asynchronous operations, the ODT signal 210 may be turned off at T7, but RTT 212 may be turned off as soon as 1 ns, but RTT would need to remain active through data transfer, so in the asynchronous case, one would wait until T11 to turn off ODT signal 210. Therefore, in the example shown in FIG. 2, there is an uncertainty of 1 ns to 9 ns associated with RTT and, as a result, another data transfer may not occur until T18. Accordingly, performance may be degraded for back to back asynchronous transfers (e.g., losing 5 clock cycles for the example shown in FIG. 2).

As previously discussed, one method for handling a DLL-off-Precharge-Power-Down (CKEs) rank's ODT is to use asynchronous ODT when ODT needs to be active for accessing other DIMM's on the same channel. Hence, the CKEs rank's "sloppy" ODT timing is forced into accesses to other DIMM's. The idle rank(s) remains in the CKEs state. As discussed with reference to FIG. 2, asynchronous ODT may force an additional three to seven cycles of turn-around delay between successive data transfers on different DIMM's due to additional uncertainty, or "slop", in the ODT timing (three cycles at the lowest frequency, seven cycles at the highest) in some situations. Because of potential performance impacts, asynchronous ODT will be used only during low memory utilization. However, in some embodiments, the asynchronous ODT of FIG. 2 may be avoided such as further discussed herein, e.g., with reference to FIGS. 3-5.

Figure 3:
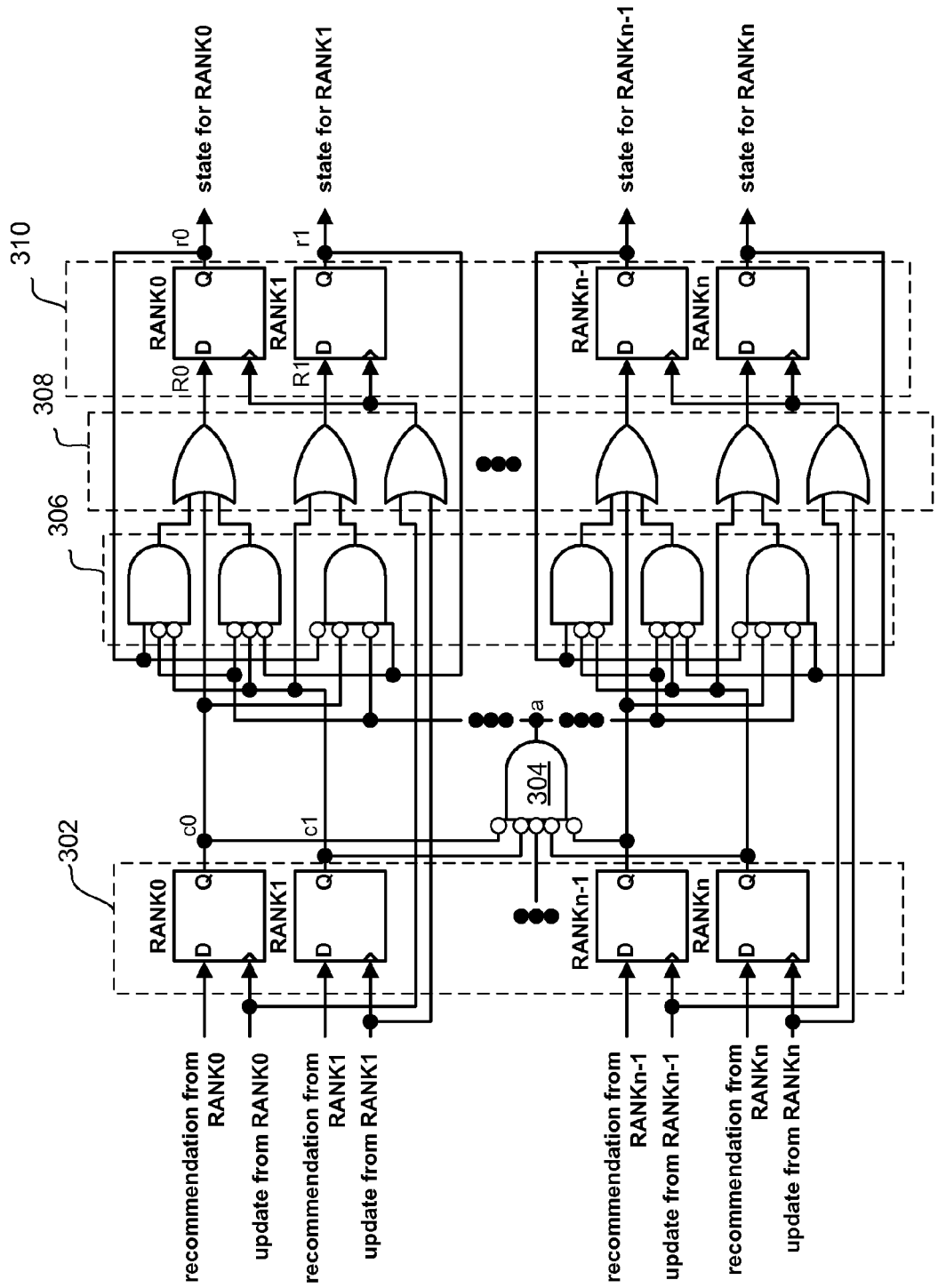
FIG. 3 illustrates an embodiment of a circuit diagram of logic that may be included in a memory controller.
Figure 6:
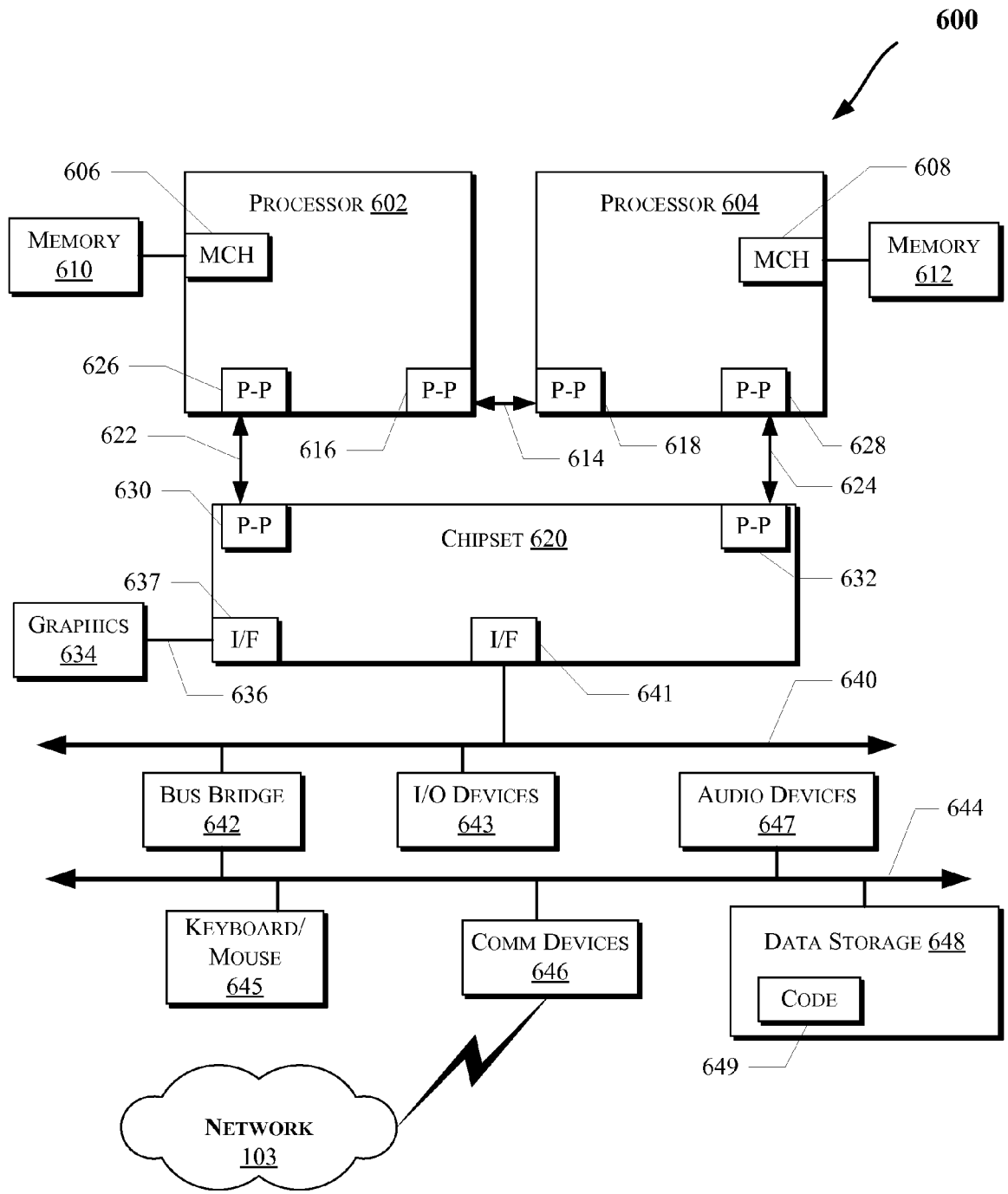

More particularly, FIG. 3 illustrates an embodiment of a circuit diagram of logic that may be included in a memory controller (such as the memory controller 110 of FIG. 1 and/or MCH 606 or 608 of FIG. 6). More particularly, FIG. 3 shows a sample logic for n/2 dual-rank DIMMs. FIG. 4 illustrates an embodiment of a logic truth table for values at various reference points shown in FIG. 3. The shaded squares in the truth table indicate arbitrary resolutions of conflicts where both recommendations for the Ranks of the DIMM were zero (CKEs) but the recommendations for all DIMMs "a" in the channel is not zero. The "recommendations" inputs may be provided in accordance with results of a predictive algorithm, e.g., which predicts the next memory power states based on statistically analyzed historical memory access data to corresponding ranks.

Referring to FIG. 3, each of the latches 302 may accordingly receive memory power state recommendations for their corresponding rank from the predictive algorithm logic (which predicts the next memory power state based on historic memory access traffic). The other "update" input to the latches 302 controls when to update the CKE power state. Outputs of the latches 302 may be provided to an AND gate 304 (with the blank circles at the inputs of various logic gates shown in FIG. 3 indicating an inversion), other AND gates 306, and OR gates 308. In an embodiment, the AND gate 304 may be replaced by a NOR gate. As illustrated in FIG. 3, latches 310 may also be coupled to the AND gates 306 and latches 302 (e.g., providing feedback).

Figure 5:
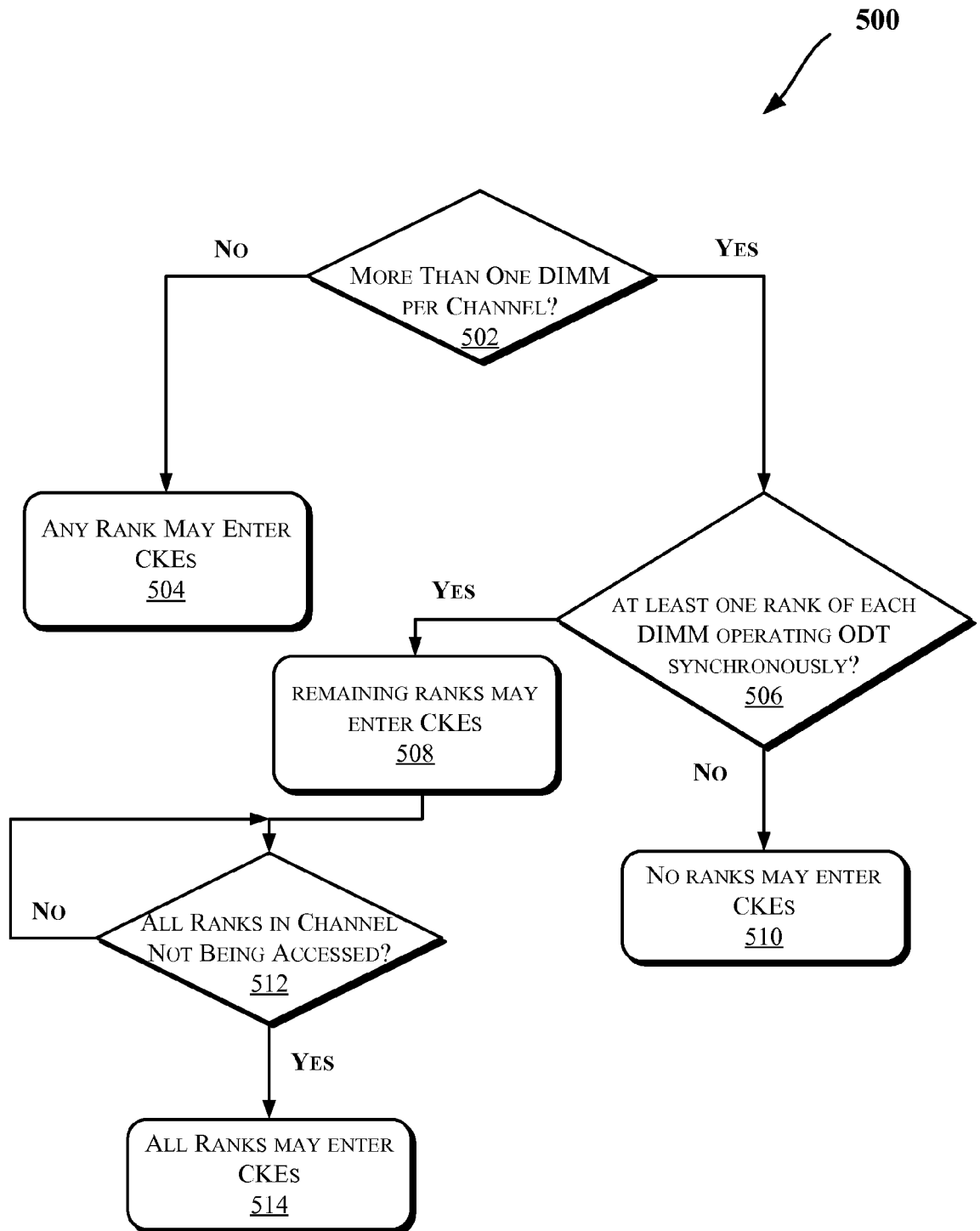
FIG. 5 illustrates a flow diagram of a method in accordance with an embodiment of the invention.

FIG. 5 illustrates a flow diagram of a method 500 to perform a memory low power policy, according to an embodiment. For example, the method 500 may be used to reduce or eliminate activation of memory device asynchronous ODT in single or multiple DIMM per channel configurations, e.g., during a power down state. In some embodiments, one or more of the components discussed with reference to FIGS. 1-3 and/or 6 may be used to perform one or more of the operations discussed with reference to FIG. 5.

Initially, as discussed herein, the term "CKEf" (or clock enable fast) refers to Precharge PD DLL on and the term "CKEs" (or clock enable slow) refers to Precharge PD DLL off. In an embodiment, any memory rank may enter CKEf. At an operation 502, it may be determined whether more than one DIMM is present per channel. In a one DIMM per Channel (DPC) implementation, any rank may enter CKEs at operation 504 (assuming the rank is not being accessed). If there is more than one DIMM per channel, it may be determined whether at least one rank of each DIMM is operating ODT synchronously at operation 506. If so, any remaining ranks not being accessed may enter CKEs at an operation 508. Otherwise, no rank may enter CKEs at an operation 510. If all ranks in a channel are not being accessed at an operation 512, they all may be put into CKEs at an operation 514.

FIG. 6 illustrates a computing system 600 that is arranged in a point-to-point (PtP) configuration, according to an embodiment of the invention. In particular, FIG. 6 shows a system where processors, memory, and input/output devices are interconnected by a number of point-to-point interfaces. The operations discussed with reference to FIGS. 1-5 may be performed by one or more components of the system 600.

As illustrated in FIG. 6, the system 600 may include several processors, of which only two, processors 602 and 604 are shown for clarity. The processors 602 and 604 may each include one or more of caches. The memories 610 and/or 612 may store various data such as those discussed with reference to the memory 212 of FIG. 6.

In an embodiment, the processors 602 and 604 may be one of the processors 602 discussed with reference to FIG. 6. The processors 602 and 604 may exchange data via a point-to-point (PtP) interface 614 using PtP interface circuits 616 and 618, respectively. Further, the processors 602 and 604 may include a high speed (e.g., general purpose) I/O bus channel in some embodiments of the invention to facilitate communication with various components (such as I/O device(s)). Also, the processors 602 and 604 may each exchange data with a chipset 620 via individual PtP interfaces 622 and 624 using point-to-point interface circuits 626, 628, 630, and 632. The chipset 620 may further exchange data with a graphics circuit 634 via a graphics interface 636, e.g., using a PtP interface circuit 637.

At least one embodiment of the invention may utilize the processors 602 and 604 to perform various operations, such as those discussed herein, e.g., with reference to FIGS. 1-5. Other embodiments of the invention, however, may exist in other circuits, logic units, or devices within the system 600 of FIG. 6. Furthermore, other embodiments of the invention may be distributed throughout several circuits, logic units, or devices illustrated in FIG. 6.

The chipset 620 may communicate with a bus 640 using a PtP interface circuit 641. The bus 640 may communicate with one or more devices, such as a bus bridge 642 and I/O devices 643. Via a bus 644, the bus bridge 642 may communicate with other devices such as a keyboard/mouse 645, communication devices 646 (such as modems, network interface devices, or other communication devices that may communicate with the computer network 103, including for example, the network adapter 230 of FIG. 2), audio I/O device 647, and/or a data storage device 648. The data storage device 648 may store code 649 that may be executed by the processors 602 and/or 604.

In various embodiments of the invention, the operations discussed herein, e.g., with reference to the figures, may be implemented as hardware (e.g., logic circuitry), software, firmware, or any combinations thereof, which may be provided as a computer program product, e.g., including a machine-readable or computer-readable medium having stored thereon instructions (or software procedures) used to program a computer (e.g., including a processor) to perform a process discussed herein. The machine-readable medium may include a storage device such as those discussed herein. Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
   logic to determine whether at least one rank of a dual in-line memory module (DIMM), from a plurality of DIMMs present on a single communication channel, is operating on-die termination synchronously and cause one or more remaining ranks of the DIMM to enter a clock enable slow mode in response to an indication that the at least one rank of the DIMM is operating on-die termination synchronously,
   wherein the clock enable slow mode corresponds to a precharge power down state for a delay-locked loop off mode in the DIMM.

2. The apparatus of claim 1, further comprising a memory controller coupled to the channel to cause at least one rank of the DIMM to operate on-die termination synchronously.

3. The apparatus of claim 1, further comprising a memory controller that comprises the logic.

4. The apparatus of claim 1, wherein the logic comprises a first plurality of latches to store recommendation values for respective ranks of the DIMM and a second plurality of latches to generate update values for respective ranks of the DIMM.

5. The apparatus of claim 4, wherein the logic comprises an AND gate coupled to the first plurality of latches to generate an output corresponding to the recommendation for all of the plurality of DIMMs.

6. The apparatus of claim 5, wherein all inputs of the AND gate are inverted.

7. The apparatus of claim 4, further comprising one or more AND gates and OR gates coupled between the first plurality of latches and the second plurality of latches.

8. The apparatus of claim 1, further comprising a processor to access data stored in the plurality of DIMMs, wherein the processor comprises one or more processor cores.

9. The apparatus of claim 1, wherein the logic is to cause all ranks of the DIMM to enter the clock enable slow mode based on a prediction that all ranks on a corresponding channel may enter the clock enable slow mode.

10. The apparatus of claim 1, wherein the logic is to cause all ranks of the DIMM to enter a clock enable slow mode based on a determination that only one DIMM exists per channel.

11. The apparatus of claim 1, wherein the logic is to allow any memory rank of the DIMM to enter clock enable fast mode.

12. A method comprising:
    determining whether at least one rank of a DIMM, from a plurality of DIMMs present on a single communication channel, in a memory is operating on-die termination synchronously; and
    causing one or more remaining ranks of the DIMM to enter a clock enable slow mode in response to an indication that the at least one rank of the DIMM is operating on-die termination synchronously,
    wherein the clock enable slow mode corresponds to a precharge power down state for a delay-locked loop off mode in the DIMM.

13. The method of claim 12, further comprising causing all ranks of the DIMM to enter the clock enable slow mode based on a prediction that all ranks on a corresponding channel may enter the clock enable slow mode.

14. The method of claim 12, further comprising causing all ranks of the DIMM to enter a clock enable slow mode based on a determination that only one DIMM exists per channel.

15. The method of claim 12, further comprising allowing any memory rank of the DIMM to enter clock enable fast mode.

16. A system comprising:
    a memory to store data, wherein the memory comprises a plurality of DIMMs present on a single communication channel;
    a processor to process the data, wherein the processor is coupled to the memory via a memory controller;
    the memory controller comprising logic to determine whether at least one rank of a DIMM, from the the plurality of DIMMS, is operating on-die termination synchronously and cause one or more remaining ranks of the DIMM to enter a clock enable slow mode in response to an indication that the at least one rank of the DIMM is operating on-die termination synchronously,
    wherein the clock enable slow mode corresponds to a precharge power down state for a delay-locked loop off mode in the DIMM.

17. The system of claim 16, wherein the memory controller is to cause at least one rank of the DIMM to operate on-die termination synchronously.

18. The system of claim 16, wherein the logic comprises a first plurality of latches to store recommendation values for respective ranks of the DIMM and a second plurality of latches to generate update values for respective ranks of the DIMM.

19. The system of claim 16, further comprising an audio device coupled to the memory.

20. The apparatus of claim 1, wherein the logic is to allow any memory rank of the DIMM to enter clock enable fast mode and wherein the clock enable fast mode corresponds to a precharge power down state for delay-locked loop on mode in the DIMM.

21. The apparatus of claim 1, wherein the communication channel comprises a physical interface between a memory controller and the plurality of DIMMs.

* * * * *

UNITED STATES PATENT AND TRADEMARK OFFICE
CERTIFICATE OF CORRECTION

| | | |
|---|---|---|
| PATENT NO. | : 8,719,606 B2 | Page 1 of 1 |
| APPLICATION NO. | : 12/059994 | |
| DATED | : May 6, 2014 | |
| INVENTOR(S) | : Son H. Lam et al. | |

It is certified that error appears in the above-identified patent and that said Letters Patent is hereby corrected as shown below:

On the Title Page, item (56), in column 2, under "Other Publications", line 8, delete "Device"," and insert -- Devices", --, therefor.

In the Drawings

On sheet 6 of 6, in Figure. 6, Reference Numeral 634, line 1, delete " GRAPIICS " and insert -- GRAPHICS --, therefor.

In the Claims

In column 8, line 32, in claim 16, delete "the the" and insert -- the --, therefor.

In column 8, line 33, in claim 16, delete "DIMMS," and insert -- DIMMs, --, therefor.

Signed and Sealed this
Twelfth Day of August, 2014

Michelle K. Lee
*Deputy Director of the United States Patent and Trademark Office*